(12) United States Patent
Bennett et al.

(10) Patent No.: US 9,006,708 B2
(45) Date of Patent: Apr. 14, 2015

(54) LOW-RESISTIVITY P-TYPE GASB QUANTUM WELLS

(71) Applicants: Brian R. Bennett, Arlington, VA (US);
Theresa F. Chick, Alexandria, VA (US);
Mario G. Ancona, Alexandria, VA (US);
John Bradley Boos, Springfield, VA (US)

(72) Inventors: Brian R. Bennett, Arlington, VA (US);
Theresa F. Chick, Alexandria, VA (US);
Mario G. Ancona, Alexandria, VA (US);
John Bradley Boos, Springfield, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 13/895,387

(22) Filed: May 16, 2013

(65) Prior Publication Data

US 2014/0217363 A1      Aug. 7, 2014

Related U.S. Application Data

(60) Provisional application No. 61/761,286, filed on Feb. 6, 2013.

(51) Int. Cl.
*H01L 29/12* (2006.01)
*H01L 29/205* (2006.01)
*H01L 29/778* (2006.01)

(52) U.S. Cl.
CPC ............ *H01L 29/122* (2013.01); *H01L 29/205* (2013.01); *H01L 29/7783* (2013.01)

(58) Field of Classification Search
None
See application file for complete search history.

(56) References Cited

U.S. PATENT DOCUMENTS

| 4,829,347 | A | | 5/1989 | Cheng et al. | |
|---|---|---|---|---|---|
| 5,349,214 | A | * | 9/1994 | Tehrani et al. | 257/192 |

(Continued)

OTHER PUBLICATIONS

Desplanque et al., High mobility metamorphic AlSb/InAs heterostructures grown on InP substrates, Jan. 23, 2007, Journal of Crystal Growth 301-302, pp. 194-198.*

(Continued)

*Primary Examiner* — Zandra Smith
*Assistant Examiner* — Molly Reida
(74) *Attorney, Agent, or Firm* — US Naval Research Laboratory; Joslyn Barritt

(57) ABSTRACT

A semiconductor device including a heterostructure having at least one low-resistivity p-type GaSb quantum well is provided. The heterostructure includes a layer of $In_{0.52}Al_{0.48}As$ on an InP substrate, where the $In_{0.52}Al_{0.48}As$ is lattice matched to InP, followed by an $AlAs_xSb_{1-x}$ buffer layer on the $In_{0.52}Al_{0.48}As$ layer, an $AlAs_xSb_{1-x}$ spacer layer on the $AlAs_xSb_{1-x}$ buffer layer, a GaSb quantum well layer on the $AlAs_xSb_{1-x}$ spacer layer, an $AlAs_xSb_{1-x}$ barrier layer on the GaSb quantum well layer, an $In_{0.2}Al_{0.8}Sb$ etch-stop layer on the $AlAs_xSb_{1-x}$ barrier layer, and an InAs cap. The semiconductor device is suitable for use in low-power electronic devices such as field-effect transistors.

10 Claims, 4 Drawing Sheets

(56) References Cited

U.S. PATENT DOCUMENTS

| | | |
|---|---|---|
| 6,232,624 B1 | 5/2001 | Matloubian et al. |
| 2010/0245969 A1 | 9/2010 | Nagase et al. |

OTHER PUBLICATIONS

B. R. Bennett, R. Magno, J. B. Boos, W. Kruppa, and M. G. Ancona, "Antimonide-based compound semiconductors for electronic devices," Solid-State Electronics 49, 1875-1895 (2005).

R. Chau, S. Datta, M. Doczy, B. Doyle, J. Jin, J. Kavalieros, A. Majumdar, M. Metz, and M. Radosavljevic, "Benchmarking Nanotechnology for High-Performance and Low-Power Logic Transistor Applications," IEEE Transactions on Nanotechnology 4, 153-158 (2005).

B. R. Bennett, M. G. Ancona, and J. B. Boos, "Compound Semiconductors for Low-Power p-Channel Field Effect Transistors," MRS Bulletin 34, 530-536 (2009).

B. R. Bennett, M. G. Ancona, J. B. Boos, C. B. Canedy, and S. A. Khan, "Strained GaSb/AlAsSb quantum wells for p-channel field effect transistors," Journal of Crystal Growth 311, 47-53 (2008).

B. R. Bennett, M. G. Ancona, J. Brad Boos, and B. V. Shanabrook, "Mobility enhancement in strained p-InGaSb quantum wells," Applied Physics Letters 91, 042104 (2007).

M. Radosavljevic, et al., "High-Performance 40nm Gate Length InSb p-Channel Compressively Strained Quantum Well Field Effect Transistors for Low-Power (Vcc=0.5 V) Logic Applications," IEEE International Electron Devices Meeting 2008, Technical Digest, 727-730.

V. Tokranov, P. Nagaiah, M. Yakimov, R. J. Matyi, and S. Oktyabrsky, "AlGaAsSb superlattice buffer layer for p-channel GaSb quantum well on GaAs substrate," Journal of Crystal Growth 323, 35-38 (2011).

A. M. Kusters, A. Kohl, V. Sommer, R. Muller, and K. Heime, "Optimized double heterojunction pseudomorphic InP/InxGa 1-xAs/InP (0.64 ≤x≤0.82) p-MODFETs and the role of strain in their design," IEEE Transactions on Electron Devices 40, 2164-2170 (1993).

P. Nagaiah, V. Tokranov, M. Yakimov, and S. Oktyabrsky, Performance and Reliability of Semiconductor Devices, MRS Proc. 1108, 231-236 (2009).

B. R. Bennett, T. F. Chick, M. G. Ancona, and J. B. Boos, "Enhanced hole mobility and density in GaSb quantum wells," Solid-State Electronics 79, 274-280 (2013).

R. Pillarisetty, et al., "High Mobility Strained Germanium Quantum Well Field Effect Transistor as the P-Channel Device Option for Low Power (Vcc=0.5 V) III-V CMOS Architecture," 2010 International Electron Devices Meeting—Technical Digest (2010).

A. Nainani, B. R. Bennett, J. B. Boos, M. G. Ancona, and K. C. Saraswat, "Enhancing hole mobility in III-V semiconductors," Journal of Applied Physics 111, 103706 (2012).

N. Kuze et al., "Molecular beam epitaxial growth of high electron mobility InAs/AlGaAsSb deep quantum well structures," Journal of Crystal Growth 175/176 (1997) 868-872.

M. Borg et al., "Effect of gate length in InAs/AlSb HEMTs biased for low power or high gain," Solid-State Electronics 52 (2008) 775-781.

S. H. Shin et al., "Effects of the AlSb Buffer Layer and the InAs Channel Thickness on the Electrical Properties of InAs/AlSb-Based 2-DEG HEMT Structures," Journal of the Korean Physical Society, vol. 53, No. 5, (2008) pp. 2719-2724.

C.-I. Kuo et al., "Effect of Gate Length on Device Performances of AlSb/InAs High Electron Mobility Transistors Fabricated Using BCl3 Dry Etching," Japanese Journal of Applied Physics 51 (2012) 060202.

B. R. Bennett, B. P. Tinkham, J. B. Boos, M. D. Lange and R. Tsai, "Materials growth for InAs high electron mobility transistors and circuits," J. Vac. Sci. Technol. B 22(2) (2004), 688-694.

L. Desplanque et al., "High mobility metamorphic AlSb/InAs heterostructures grown on InP substrates," Journal of Crystal Growth 301, pp. 194-198 (2007).

C. K. Gaspe, et al., "Effect of strain and confinement on the effective mass of holes in InSb quantum wells," J. Vac. Sci. Technol. B 29(3) (2011), 03C110-1-03C110-4.

V. Tokranov, et al., "AlGaAsSb superlattice buffer layer for p-channel GaSb quantum well on GaAs substrate," Journal of Crystal Growth 323 (2011) 35-38.

H.-C. Ho, et al., "Device Characteristics of InGaSb/AlSb High-Hole-Mobility FETs," IEEE Electron Device Letters, vol. 33, No. 7, (2012), 964-966.

S. K. Madisetti et al. "Hole mobility and remote scattering in strained InGaSb quantum well MOSFET channels with Al2O3 oxide," Phys. Status Solidi RRL, 1-4 (2013).

C.-H. Yu, et al. "Performance Evaluation of InGaSb/AlSb P-Channel High-Hole-Mobility Transistor Fabricated Using BCl3 Dry Etching," Japanese Journal of Applied Physics 52 (2013) 020203.

B. R. Bennett, et al., "Enhanced hole mobility and density in GaSb quantum wells," Solid-State Electronics 79 (2013) 274-280.

\* cited by examiner

LOW-RESISTIVITY P-TYPE GASB QUANTUM WELLS

CROSS-REFERENCE

This application is a Nonprovisional of and claims the benefit of priority under 35 U.S.C. §119 based on U.S. Provisional Patent Application No. 61/761,286 filed on Feb. 6, 2013, the entirety of which is hereby incorporated by reference into the present application.

TECHNICAL FIELD

The present invention relates to semiconductor structures for use in low-power electronic devices such as field-effect transistors.

BACKGROUND

High speed, low power-consuming devices such as complementary metal-oxide semiconductor (CMOS) devices are highly desirable in numerous devices. Such devices include low-noise receivers and transmitters in the 10-300 GHz range used in space-based radar and communications; portable communications and RFID tags; long-endurance micro-air-vehicles (MAVs); high-efficiency, high-linearity amplifiers; and distributed autonomous sensing devices. Other devices include mixed-signal and ultra-low-power logic circuits used for A/D conversion, direct digital frequency synthesis, multiplexing, and demultiplexing.

Narrow bandgap compound semiconductors are candidates for high-frequency electronics because they exhibit high electron mobilities and peak velocities. The high velocities are reached at relatively low electric fields, enabling analog electronic devices with extremely low power consumption. For example, a Northrop-Grumman/NRL collaboration produced low-noise amplifiers (LNAs) using high-electron-mobility transistors (HEMTs) with InAs channels and AlSb barriers that operate at substantially lower power than similar circuits based upon GaAs or Si. See B. R. Bennett, R. Magno, J. B. Boos, W. Kruppa, and M. G. Ancona, *Solid-State Electronics* 49, 1875-1895 (2005).

Researchers at the Naval Research Laboratory are currently working to develop similar low-power technology for digital and mixed-signal circuits. For these applications, a key to low power operation is the ability to make a circuit using complementary n- and p-channel FETs (the "C" in CMOS). R. Chau, S. Datta, M. Doczy, B. Doyle, J. Jin, J. Kavalieros, A. Majumdar, M. Metz, and M. Radosavljevic, *IEEE Transactions on Nanotechnology* 4, 153-158 (2005). The p-FETs require heterostructures with high hole mobility and sheet density; the inverse of the product of the mobility and sheet density is the sheet resistivity.

The performance of p-FETs has been limited by high values of contact and access resistances which are a function of the sheet resistivity. In recent years, work by NRL, an Intel/QinetiQ collaboration, and SUNY-Albany used compressive strain and confinement in antimonide semiconductors to modify the band structure and achieve hole mobilities greater than 1000 cm$^2$/V-s. Each group investigated antimonide quantum wells (QWs) on GaAs substrates and reported sheet resistivities as low as 3000-5000 Ω/□. See B. R. Bennett, M. G. Ancona, and J. B. Boos, *MRS Bulletin* 34, 530-536 (2009) (Bennett 2009); B. R. Bennett, M. G. Ancona, J. B. Boos, C. B. Canedy, and S. A. Khan, *Journal of Crystal Growth* 311, 47-53 (2008) (Bennett 2008); and B. R. Bennett, M. G. Ancona, J. Brad Boos, and B. V. Shanabrook, *Applied Physics Letters* 91, 042104 (2007) (Bennett 2007), each of which is hereby incorporated by reference into the present disclosure in its entirety. See also M. Radosavljevic, T. Ashley, A. Andreev, S. D. Coomber, G. Dewey, M. T. Emeny, M. Fearn, D. G. Hayes, K. P. Hilton, M. K. Hudait, R. Jefferies, T. Martin, R. Pillarisetty, W. Rachmady, T. Rakshit, S. J. Smith, M. J. Uren, D. J. Wallis, P. J. Wilding, and R. Chau, *IEEE International Electron Devices Meeting* 2008, *Technical Digest*, 727-730; and V. Tokranov, P. Nagaiah, M. Yakimov, R. J. Matyi, and S. Oktyabrsky, *Journal of Crystal Growth* 323, 35-38 (2011).

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides a semiconductor device suitable for use in low-power electronic devices such as field-effect transistors, where the device includes a semiconductor heterostructure having one or more p-type QWs with low resistivity.

A semiconductor device in accordance with the present invention includes a heterostructure having at least one low-resistivity p-type GaSb QW.

In accordance with the present invention, such a heterostructure can include a layer of In$_w$Al$_{1-w}$As on a semi-insulating (100) InP substrate, where the In$_w$Al$_{1-w}$As is lattice matched to InP, followed by an AlAs$_x$Sb$_{1-x}$ buffer layer on the In$_w$Al$_{1-w}$As layer, an AlAs$_x$Sb$_{1-x}$ spacer layer on the first AlAs$_x$Sb$_{1-x}$ buffer layer, a GaSb QW layer on the AlAs$_x$Sb$_{1-x}$ spacer layer, an AlAs$_x$Sb$_{1-x}$ barrier layer on the GaSb QW layer, an In$_y$Al$_{1-y}$Sb layer on the AlAs$_x$Sb$_{1-x}$ barrier layer, and finally an InAs cap.

In some embodiments, the structure also can include a Be- or C-doped AlAs$_x$Sb$_{1-x}$ donor layer situated on a lower side of the GaSb QW layer between the AlAs$_x$Sb$_{1-x}$ buffer layer and the AlAs$_x$Sb$_{1-x}$ spacer layer.

In other embodiments, a Be- or C-doped AlAs$_x$Sb$_{1-x}$ donor layer can be situated on an upper side of the GaSb QW layer; in such embodiments, the AlAs$_x$Sb$_{1-x}$ spacer layer is situated on the GaSb QW layer rather than on the AlAs$_x$Sb$_{1-x}$ buffer layer, with the doped AlAs$_x$Sb$_{1-x}$ donor layer being situated between the AlAs$_x$Sb$_{1-x}$ spacer layer and the AlAs$_x$Sb$_{1-x}$ buffer layer.

Still other embodiments can include a Be- or C-doped AlAs$_x$Sb$_{1-x}$ donor layer on both sides of the GaSb QW layer, with each AlAs$_x$Sb$_{1-x}$ donor layer being separated from the AlAs$_x$Sb$_{1-x}$ buffer layer/AlAs$_x$Sb$_{1-x}$ barrier layer by a respective AlAs$_x$Sb$_{1-x}$ spacer layer.

In some embodiments, Ga can be added to one or more of the AlAsSb layers in a concentration of up to 30 mol %.

Finally, in some embodiments, InGaSb can be used instead of GaSb for the QW layer.

Such a heterostructure in accordance with the present invention can be grown by molecular beam epitaxy on a semi-insulating InP substrate.

In an exemplary embodiment, such a heterostructure comprises a 160 nm layer of In$_{0.52}$Al$_{0.48}$As on the InP substrate, where the In$_{0.52}$Al$_{0.48}$As is lattice matched to InP, followed by a ~1.3 µm buffer layer of AlAs$_x$Sb$_{1-x}$ on the In$_{0.52}$Al$_{0.48}$As layer, a 9.5 nm AlAs$_x$Sb$_{1-x}$ spacer layer on the buffer layer, a 5-10 nm GaSb QW layer on the spacer layer, a 10.5 nm $AlAs_xSb_{1-x}$ barrier layer on the QW layer, a 4 nm $In_{0.2}Al_{0.8}Sb$ etch-stop layer on the barrier layer, and finally a 2 nm InAs cap. In a second exemplary embodiment, the heterostructure further includes a 4 nm Be-doped $AlAs_xSb_{1-x}$ donor layer between the $AlAs_xSb_{1-x}$ buffer layer and the $AlAs_xSb_{1-x}$ spacer layer.

BRIEF DESCRIPTION OF THE DRAWINGS

FIG. 1A depicts an exemplary cross-section of such a semiconductor heterostructure and FIG. 1B depicts calculated band structure for a heterostructure having an $AlAs_{0.25}Sb_{0.75}/GaSb/AlAs_{0.25}Sb_{0.75}$ QW and a hole sheet density of $1.0 \times 10^{12}/cm^2$.

DETAILED DESCRIPTION

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides a semiconductor device suitable for use in low-power electronic devices such as field-effect transistors, where the device includes a semiconductor heterostructure having one or more p-type QWs with low resistivity.

A semiconductor device in accordance with the present invention includes a heterostructure having at least one low-resistivity p-type GaSb QW.

In accordance with the present invention, such a heterostructure can include a layer of $In_wAl_{1-w}As$ on a semi-insulating (100) InP substrate, where the $In_wAl_{1-w}As$ is lattice matched to InP, followed by an $AlAs_xSb_{1-x}$ buffer layer on the $In_wAl_{1-w}As$ layer, an $AlAs_xSb_{1-x}$ spacer layer on the first $AlAs_xSb_{1-x}$ buffer layer, a GaSb QW layer on the $AlAs_xSb_{1-x}$ spacer layer, an $AlAs_xSb_{1-x}$ barrier layer on the GaSb QW layer, an $In_yAl_{1-y}Sb$ layer on the $AlAs_xSb_{1-x}$ barrier layer, and finally an InAs cap.

In some embodiments, the structure also can include a Be- or C-doped $AlAs_xSb_{1-x}$ donor layer situated on a lower side of the GaSb QW layer between the $AlAs_xSb_{1-x}$ buffer layer and the $AlAs_xSb_{1-x}$ spacer layer.

In other embodiments, a Be- or C-doped $AlAs_xSb_{1-x}$ donor layer can be situated on an upper side of the GaSb QW layer; in such embodiments, the $AlAs_xSb_{1-x}$ spacer layer is situated on the GaSb QW layer rather than on the $AlAs_xSb_{1-x}$ buffer layer, with the doped $AlAs_xSb_{1-x}$ donor layer being situated between the $AlAs_xSb_{1-x}$ spacer layer and the $AlAs_xSb_{1-x}$ buffer layer.

Still other embodiments can include a Be- or C-doped $AlAs_xSb_{1-x}$ donor layer on both sides of the GaSb QW layer, with each $AlAs_xSb_{1-x}$ donor layer being separated from the $AlAs_xSb_{1-x}$ buffer layer/$AlAs_xSb_{1-x}$ barrier layer by a respective $AlAs_xSb_{1-x}$ spacer layer.

In some embodiments, Ga can be added to one or more of the AlAsSb layers in a concentration of up to 30 mol %.

Finally, in some embodiments, InGaSb can be used instead of GaSb for the QW layer.

Figure 1B:
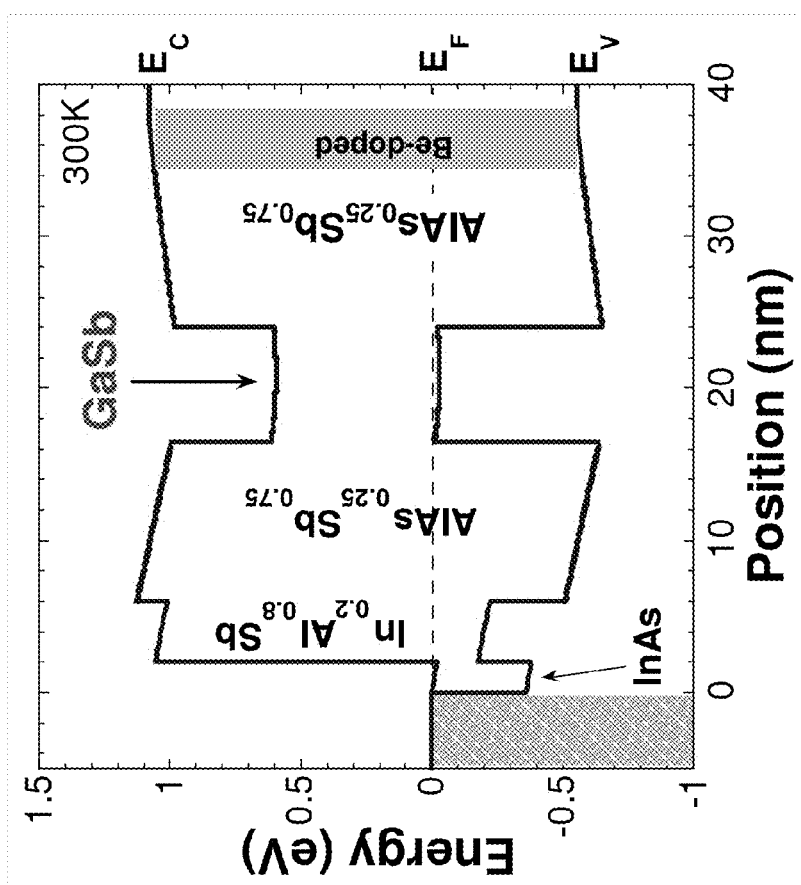
FIGS. 1A and 1B depict aspects of an exemplary embodiment of a semiconductor heterostructure having a low-resistivity p-type GaSb QW in accordance with the present invention, where
Figure 1A:
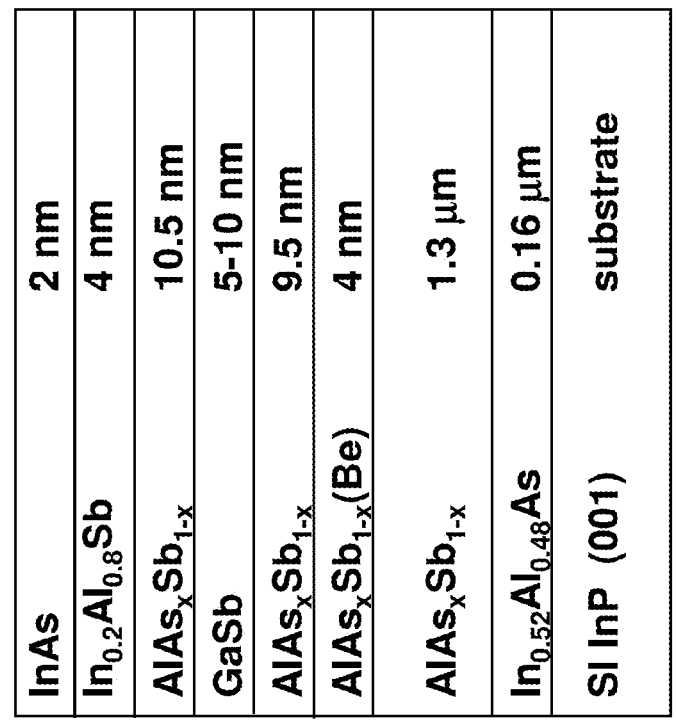

FIG. 1A is a block diagram illustrating an exemplary embodiment of a heterostructure having a GaSb QW in accordance with the present invention. As illustrated in FIG. 1A, such a heterostructure comprises a 160 nm layer of $In_{0.52}Al_{0.48}As$ on the InP substrate, where the $In_{0.52}Al_{0.48}As$ is lattice matched to InP, followed by a ~1.3 μm buffer layer of $AlAs_xSb_{1-x}$ on the $In_{0.52}Al_{0.48}As$ layer, a 4 nm Be-doped $AlAs_xSb_{1-x}$ donor layer, a 9.5 nm $AlAs_xSb_{1-x}$ spacer layer on the donor layer, a 5-10 nm GaSb QW layer on the spacer layer, a 10.5 nm $AlAs_xSb_{1-x}$ barrier layer on the QW layer, a 4 nm $In_{0.2}Al_{0.8}Sb$ etch-stop layer on the barrier layer, and finally a 2 nm InAs cap.

The inventors herein grew such a heterostructure by molecular beam epitaxy on a semi-insulating InP substrate. The $AlAs_xSb_{1-x}$ layers were grown as a digital alloy by toggling the As and Sb shutters while the Al shutter and the As and Sb valves remained open, allowing better control of composition compared to random alloys. The AlAs mole fraction was adjusted by changing the length of time the As shutter is open relative to the Sb shutter.

FIG. 1B is a band-gap diagram illustrating the calculated band-gaps of the exemplary heterostructure of FIG. 1A. As shown in the band-gap diagram of FIG. 1B, there is a large valence band discontinuity between the AlAsSb and the GaSb, providing for good confinement of holes in the GaSb.

As described in more detail below, to test the utility of the heterostructure of the present invention in providing a low-resistivity p-type quantum well, the inventors grew several wafers, which are often referred to in the Figures and herein as Wafers #4 #7.

The structure of Wafer #4 was the same as that shown in FIG. 1A, except that Wafer #4 did not have the Be-doped AlAsSb(Be) donor layer between the $AlAs_xSb_{1-x}$ buffer layer and the $AlAs_xSb_{1-x}$ spacer layer. Wafer #5 had the same structure as Wafer #4, but with a GaAs, rather than InP, substrate. Wafer #6 had the same structure as illustrated in FIG. 1A, including the Be-doped AlAsSb(Be) donor layer between the $AlAs_xSb_{1-x}$ buffer layer and the $AlAs_xSb_{1-x}$ spacer layer. Wafer #7 was similar to Wafer #6, but had double-side doping, with an $AlAs_xSb_{1-x}$ spacer layer and a Be-doped AlAsSb (Be) donor layer on both sides of the GaSb QW layer.

Figure 2:
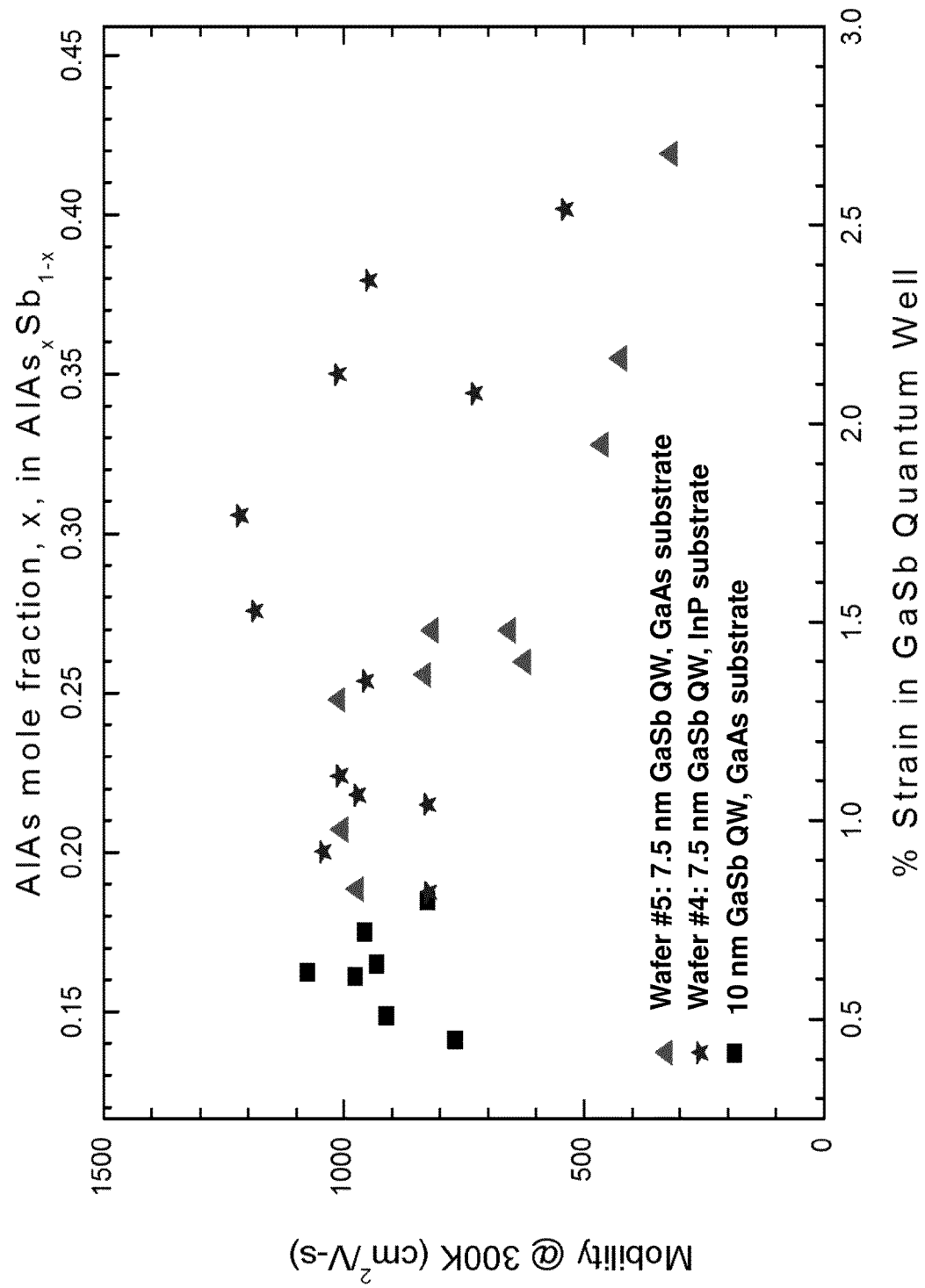
FIG. 2 is a plot depicting room-temperature mobility as a function of GaSb QW strain for samples with Be modulation doping.

FIG. 2 is a plot depicting room-temperature carrier mobility as a function of GaSb QW strain for samples with Be modulation doping. In the plot shown in FIG. 2, the square data points reflect data taken from Tokranov et al., supra, which used GaAs substrates, and show that the mobility peaks at a GaSb QW strain of about 0.6%. The inventors' earlier work (not reflected in the Figure), which also used GaAs substrates, exhibited a similar pattern, with a decrease in mobility for strains greater than about 1%. See Bennett 2008, supra.

The inventors' results for Wafer #4 reflecting QW strain for a heterostructure in accordance with the present invention, which includes an InP substrate, are plotted as stars in FIG. 2.

Figure 3:
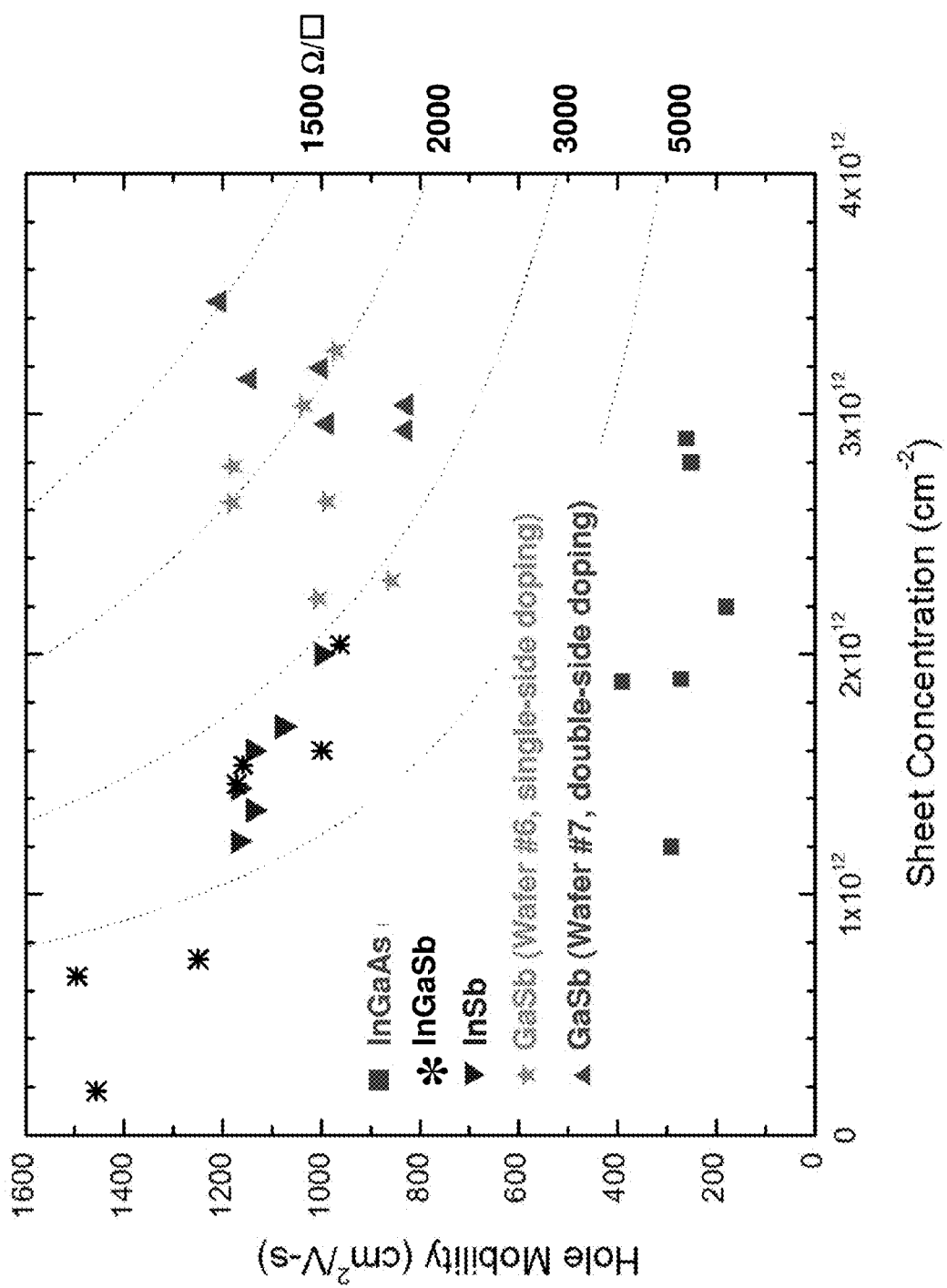
FIG. 3 is a plot depicting room-temperature hole mobility as a function of sheet concentration, reflecting data obtained for GaSb QWs in semiconductor wafers grown in accordance with the present invention as well as data from the literature for InGaSb, InSb, and InGaAs QWs.

As can be seen from the plot in FIG. 2, mobilities for this wafer remain high for strains beyond 2%. To confirm the role of the InP substrate in such high mobilities, the inventors grew Wafer #5, which was identical to Wafer #4 except that its substrate was GaAs rather than InP and the InAlAs buffer layer is replaced by epitaxial GaAs. The results for Wafer #5 are plotted as triangles in FIG. 2, and show decreasing mobility for strains above 1.3%, in rough agreement with the earlier experiments on GaAs substrates, and thus show the beneficial results from using an InP substrate as in the present invention The plot shown in FIG. 3 illustrates hole mobility as a function of sheet concentration, with the data points reflecting InSb and InGaSb sheet concentrations being shown by inverted triangles and asterisks, respectively. As can be seen from the plots in FIG. 3, the hole mobilities for both of these QW materials decrease as carrier density increases.

To explore the relationship between sheet concentration and hole mobility for GaSb/AlAsSb/InP heterostructures, the inventors grew two wafers, Wafers #6 and #7, each of which having a GaSb layer having thickness of 7.5 nm and a buffer layer having a composition of $AlAs_{0.29}Sb_{0.7}$ corresponding to a GaSb strain of 1.7%. The samples were rotated during the growth of all layers except the Be-doped AlAsSb donor layer(s); the non-rotation of the sample during growth of the Ge-doped layer, which the inventors believe should yield a gradient in Be concentration across the wafer and hence allow a range of hole densities to be investigated with a single growth. In Wafers #6 and #7, the sheet densities varied by a factor of 1.5 across the wafer.

As noted above, Wafer #6 had a single Be-doped AlAsSb (Be) donor layer between the $AlAs_xSb_{1-x}$ buffer layer and the $AlAs_xSb_{1-x}$ spacer layer, as in the configuration shown in FIG. 1A. Its hole mobility as a function of sheet concentration is plotted in FIG. 3, with its data points shown as stars in the plot. Wafer #7 had double-side doping, with 4 nm layers of AlAsSb(Be) on both sides of the QW and 5.4 nm spacer layers. The results for Wafer #7, shown as up-triangles in FIG. 3, show less variation in sheet density across the wafer than for #6. Simulations show that this is likely due to a saturation in the ability of the modulation doping to transfer charge. However, in both Wafer #6 and Wafer #7, unlike those the InSb and InGaSb QWs, the mobility of GaSb QWs does not degrade as the density increases over the range studied.

As a result, we observe sheet resistivities to drop as low as 1500 Ω/□, a factor of two improvement over the best values for InSb and InGaSb, and much lower than for other III-V materials. We also include data from the literature for p-InGaAs QWs, illustrated by the square data points, which show that lower mobilities result in resistivities greater than 7000 Ω/□ for InGaAs. See A. M. Kusters, A. Kohl, V. Sommer, R. Muller, and K. Heime, *IEEE Transactions on Electron Devices* 40, 2164-2170 (1993); P. Nagaiah, V. Tokranov, M. Yakimov, and S. Oktyabrsky, *Performance and Reliability of Semiconductor Devices, MRS Proc.* 1108, 231-236 (2009); and H. Park, P. Mandeville, R. Saito, P. J. Tasker, W. J. Schaff, and L. F. Eastman, *Proceedings: IEEE/Cornell Conference on Advanced Concepts in High Speed Semiconductor Devices and Circuits,* 101-110 (1989). Modeling indicates that the superior properties of GaSb QWs are a result of the larger valence band offset and the consequent reduction in scattering because of the better confinement and the lower doping levels needed for a given sheet charge. See B. R. Bennett, T. F. Chick, M. G. Ancona, and J. B. Boos, *Solid-State Electronics* 79, 274-280 (2013).

Figure 4:
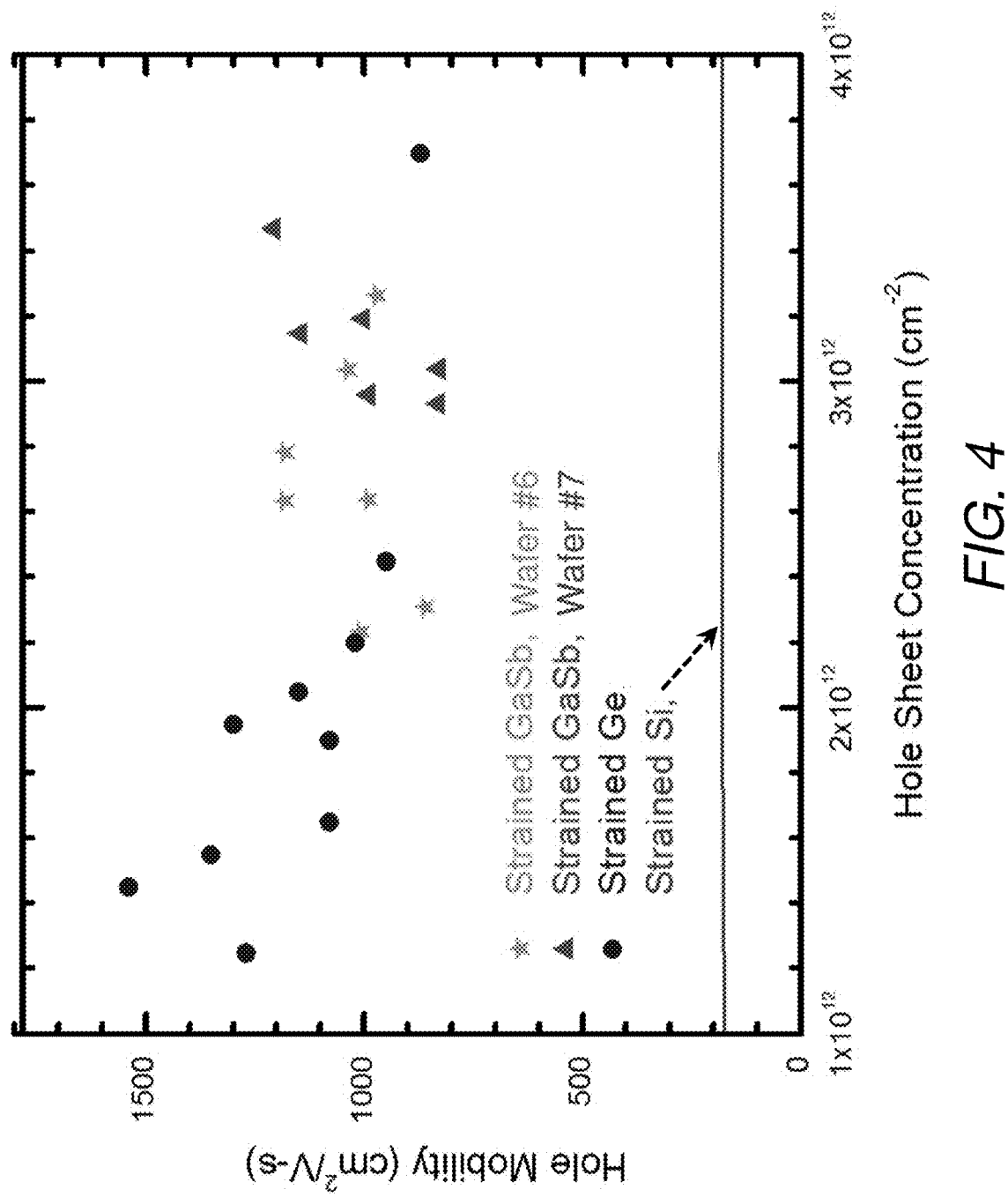
FIG. 4 is a plot depicting room-temperature hole mobility as a function of sheet concentration, reflecting data obtained for GaSb QWs in semiconductor wafers grown in accordance with the present invention as well as data from the literature for strained Ge and strained Si QWs.

It is also instructive to compare our p-channel GaSb results to strained Si, currently used for CMOS, and strained Ge, proposed for future CMOS nodes. FIG. 4 includes strained Si data, recent strained Ge data from Intel (see R. Pillarisetty, B. Chu-Kung, S. Corcoran, G. Dewey, J. Kavalieros, H. Kennel, R. Kotlyar, V. Le, D. Lionberger, M. Metz, N. Mukherjee, J. Nah, W. Rachmady, M. Radosavljevic, U. Shah, S. Taft, H. Then, N. Zelick, and R. Chau, 2010 *International Electron Devices Meeting—Technical Digest* (2010)) plus our GaSb data. The GaSb QWs, like Ge QWs, offer substantially higher mobilities and lower sheet resistivities than strained Si. Based upon results from gated hall structures on InGaSb QWs, we expect the GaSb advantage over Si to be maintained at higher carrier densities. See A. Nainani, B. R. Bennett, J. B. Boos, M. G. Ancona, and K. C. Saraswat, *Journal of Applied Physics* 111, 103706 (2012).

Advantages and New Features: The combination of GaSb/AlAsSb QWs and InP substrates enabled us to reach mobilities as high as 1500 $cm^2$/V-s, and sheet resistivities as low as 1500 Ω/□, both world records. The lower sheet resistivities will result in higher ON-currents for p-FETs. This result is an important step toward complementary n- and p-channel FETs using antimonide-based compound semiconductors. Circuits from antimonides are projected to have an order-of-magnitude lower power consumption than existing Si-based digital and mixed-signal circuits. Many military systems such as hand-held or autonomous sensors could benefit greatly from A-to-D and D-to-A converters with extremely low power consumption. In addition to CMOS, other device technologies may benefit from the advantage of p-GaSb QWs with low sheet resistivity.

Although other groups are pursuing InGaAs for the n-channel material and strained Ge for the p-channel material, these materials have different crystalline structures and lattice constants, making their integration into the present invention a significant challenge.

Although particular embodiments, aspects, and features have been described and illustrated, one skilled in the art would readily appreciate that the invention described herein is not limited to only those embodiments, aspects, and features but also contemplates any and all modifications within the spirit and scope of the underlying invention described and claimed herein, and such combinations and embodiments are within the scope of the present disclosure.

What is claimed is:

1. A semiconductor device comprising:
   an $In_{0.52}Al_{0.48}As$ layer disposed on an InP substrate, the $In_{0.52}Al_{0.48}As$ being lattice matched to the InP;
   an $AlAs_xSb_{1-x}$ buffer layer, x≥0.34, disposed on the $In_{0.52}Al_{0.48}As$ layer;
   a GaSb quantum well layer disposed the $AlAs_xSb_{1-x}$ buffer layer;
   an $AlAs_xSb_{1-x}$ barrier layer, x≥0.34, disposed on the GaSb quantum well layer;
   an $In_{0.2}Al_{0.8}Sb$ etch-stop layer disposed on the $AlAs_xSb_{1-x}$ barrier layer; and
   an InAs cap disposed on the $In_{0.2}Al_{0.8}Sb$ etch-stop layer;
   wherein the GaSb quantum well layer is a low-resistivity p-type quantum well and has a strain of greater than 2%.

2. The semiconductor device according to claim 1, wherein the $In_{0.52}Al_{0.48}As$ layer has a thickness of 160 nm.

3. The semiconductor device according to claim 1, wherein the $AlAs_xSb_{1-x}$ buffer layer has a thickness of about 1.3 μm.

4. The semiconductor device according to claim 1, wherein the GaSb quantum well layer has a thickness of about 5 to 10 nm.

5. The semiconductor device according to claim 1, wherein the $AlAs_xSb_{1-x}$ barrier layer has a thickness of 10.5 nm.

6. The semiconductor device according to claim 1, wherein the $In_{0.2}Al_{0.8}Sb$ etch-stop layer has a thickness of 4 nm.

7. The semiconductor device according to claim 1, wherein the InAs cap has a thickness of 2 nm.

8. The semiconductor device according to claim 1, further comprising an $AlAs_xSb_{1-x}$ spacer layer disposed on the $AlAs_xSb_{1-x}$ buffer layer and a Be-doped $AlAs_xSb_{1-x}$ donor layer disposed between the $AlAs_xSb_{1-x}$ buffer layer and the $AlAs_xSb_{1-x}$ spacer layer.

9. The semiconductor device according to claim 8, wherein the $AlAs_xSb_{1-x}$ spacer layer has a thickness of 9.5 nm.

10. The semiconductor device according to claim 8, wherein the Be-doped $AlAs_xSb_{1-x}$ donor layer has a thickness of 4 nm.

\* \* \* \* \*